United States Patent [19]

Miller et al.

[11] Patent Number: 5,032,826
[45] Date of Patent: Jul. 16, 1991

[54] CORE MONITOR THAT USES ROTOR SHAFT VOLTAGES

[75] Inventors: Robert C. Miller, New Alexandria, Pa.; Michael Twerdochlib, Oviedo, Fla.

[73] Assignee: Westinghouse Electric Corp., Pittsburgh, Pa.

[21] Appl. No.: 368,102

[22] Filed: Jun. 19, 1989

Related U.S. Application Data

[63] Continuation of Ser. No. 114,328, Oct. 29, 1987, abandoned.

[51] Int. Cl.$^5$ .............................................. G08B 21/00
[52] U.S. Cl. .................................... 340/647; 340/661; 324/510; 324/545
[58] Field of Search ............... 340/635, 647, 648, 649, 340/661, 662; 324/511, 545, 546, 551; 361/33, 21

[56] References Cited

U.S. PATENT DOCUMENTS

| | | |
|---|---|---|
| 2,951,166 | 8/1960 | Swanson . |
| 3,188,620 | 6/1965 | McCallum . |
| 3,831,160 | 8/1974 | Cronin et al. ................... 340/635 X |
| 4,097,794 | 6/1978 | Burrus, Jr. ............................ 324/545 |
| 4,122,388 | 10/1978 | Bernasconi et al. ................. 324/545 |
| 4,147,982 | 4/1979 | Emery ................................. 324/545 |
| 4,156,846 | 5/1979 | Harrold et al. . |
| 4,230,961 | 10/1980 | Calfo et al. . |
| 4,377,784 | 3/1983 | Saito et al. . |
| 4,446,426 | 5/1984 | Emery et al. . |
| 4,492,999 | 1/1985 | Amagasa ................................. 361/21 |
| 4,502,046 | 2/1985 | Wonn et al. ......................... 340/679 |

FOREIGN PATENT DOCUMENTS

136983 4/1950 Australia .

Primary Examiner—Joseph A. Orsino
Assistant Examiner—Jeffery A. Hofsass

[57] ABSTRACT

The present invention is a monitor that detects generator core 12 hot spots where the insulation between ferromagnetic sheets is breaking down by monitoring rotor 10 shaft voltage. The difference between the differential shaft voltage at each end of the rotor 14 produces a voltage signal that changes as the core 12 malfunctions. By comparing signal samples over time, core failure can be detected. Spring loaded rotor shaft brushes 20 and 22 connected to differential isolation amplifiers 24 and 26 obtain the voltage between ends 16 and 18 of the rotating shaft and nearby frame, and a differential amplifier 28 produces the difference between the shaft end differential voltages which is the shaft dissymmetry voltage. An analog-to-digital converter 30 produces digital values of the dissymmetry voltage which can be converted into a voltage frequency spectrum by a Fourier Transform routine executed by a computer 32 or analyzed directly. The computer 32 monitors the spectrum or time domain signal over time for changes and produces an alarm when the changes exceed a threshold. Bandpass filters 34 and a simple threshold comparison routine or analog threshold devices can substitute for the FFT routine.

8 Claims, 5 Drawing Sheets

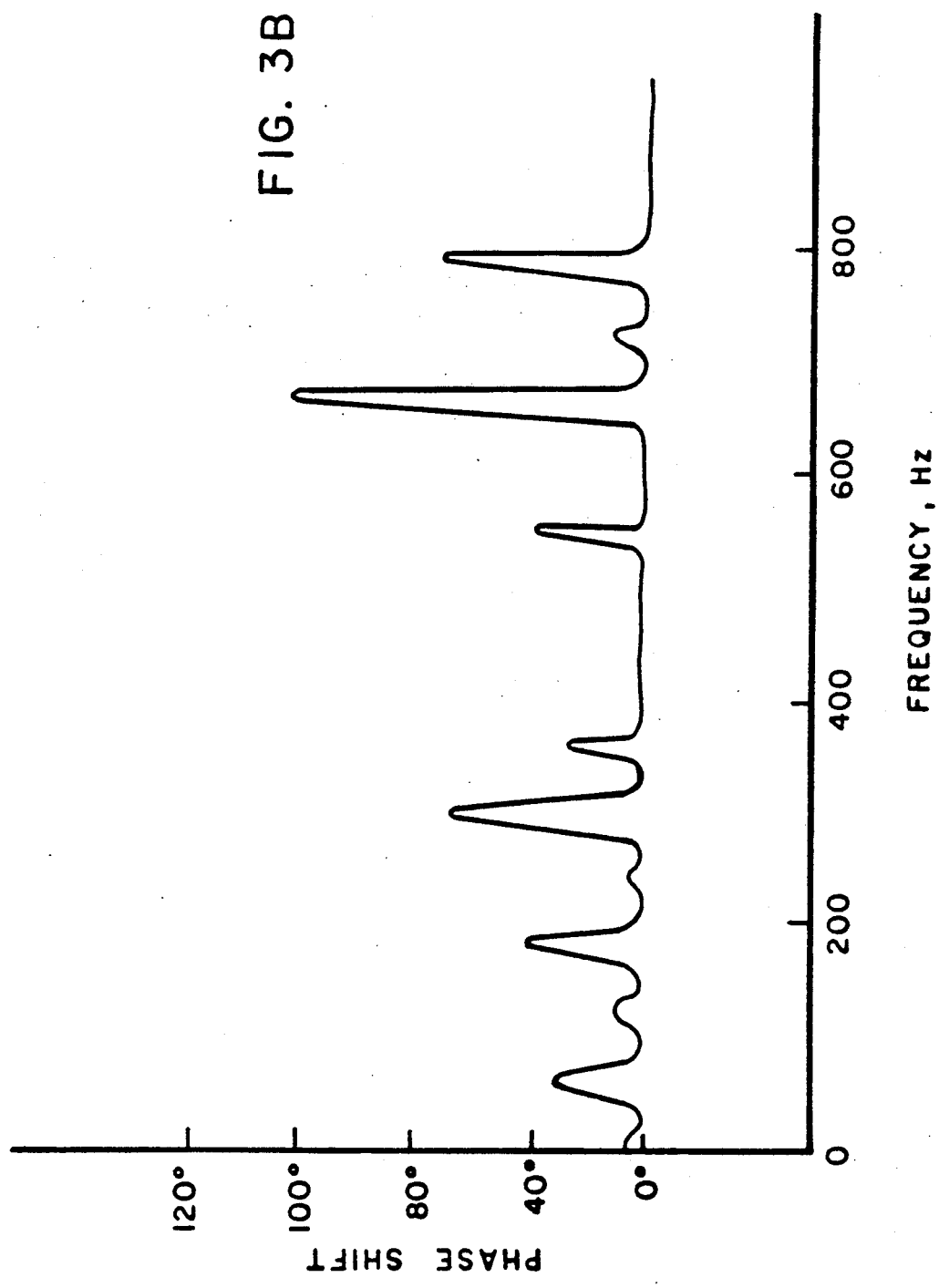

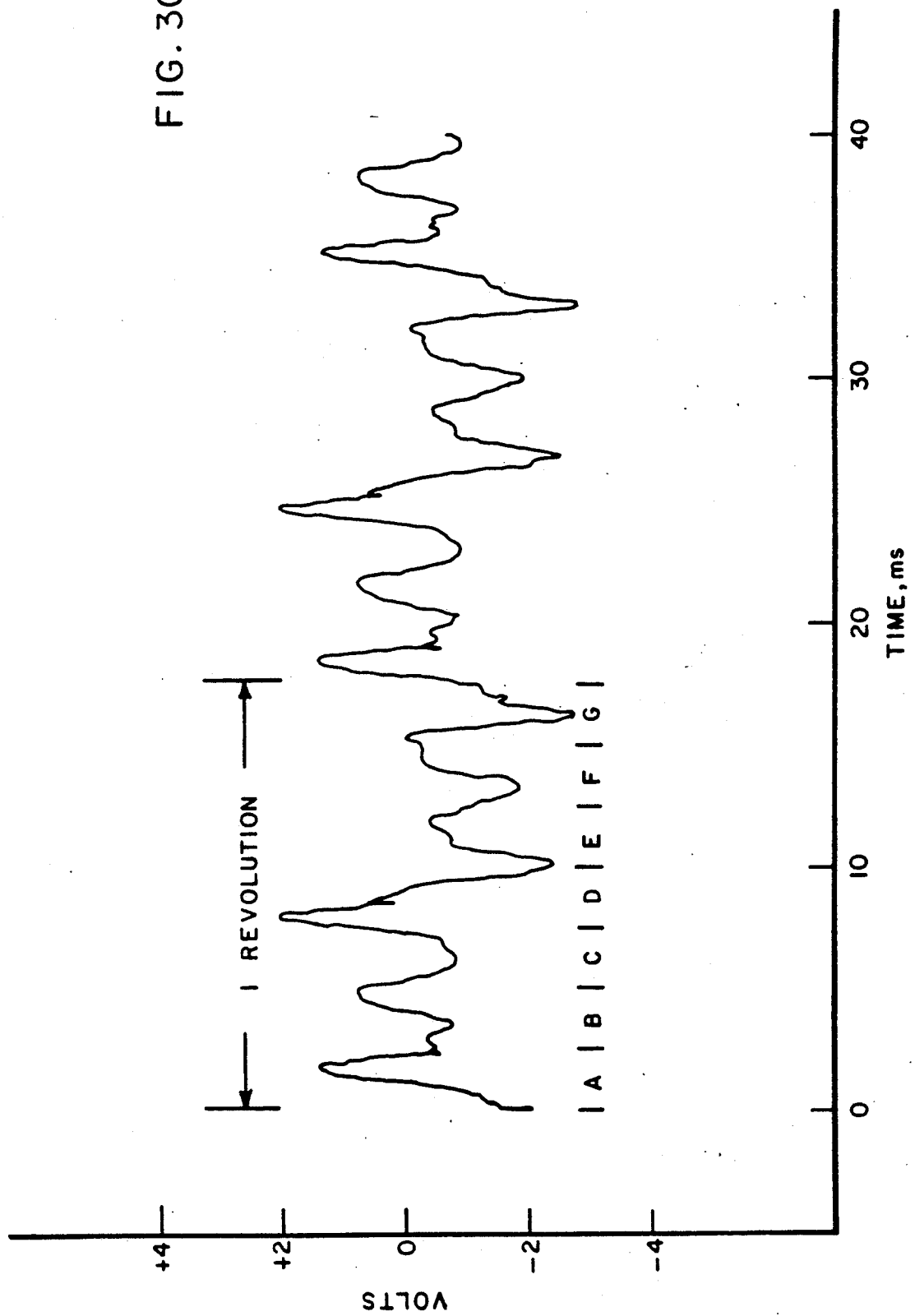

CORE MONITOR THAT USES ROTOR SHAFT VOLTAGES

This is a continuation of co-pending application Ser. No. 114,328 filed on Oct. 29, 1987, now abandoned.

BACKGROUND OF THE INVENTION

1. Field of the Invention

This invention is directed to a generator core monitor that allows a generator to be removed from service before serious damage occurs and, more particularly, to a monitor that detects the development of core hot spots by monitoring the voltage developed across the generator rotor.

2. Description of the Prior Art

A modern generator 8 includes a rotor 14 rotating inside a core 12 surrounded by core windings 13 as illustrated conceptually in FIG. 1. The laminated core 12 of large generators is formed using insulated sheets of ferromagnetic material held together under compression. The surface insulation on the ferromagnetic plates prevents formation of large circulating eddy currents that would be created in the core 12 by the rapidly changing magnetic flux created by the rotor 14. When the insulation breaks down and the insulated ferromagnetic sheets become shorted, large circulating eddy currents are induced in the core 12. The resulting $I^2R$ heating accelerates failure of the insulation which in turn leads to even higher circulating currents. Severe generator core 12 damage rapidly occurs due to core 12 melting. The melting core 12 can also damage the windings 13 producing a very costly generator failure. If arcing between the stator windings and/or core 12 occurs, the rotor 14 can also be badly damaged.

Prior art generator core monitors are ineffective in detecting generator core failures because the detection mechanism is based on detecting the presence of particulate matter in a circulating hydrogen coolant gas that circulates through the core and windings. A modern core includes inorganic insulation sheets that produce very little particulate matter when breakdown or overheating occurs. Particulate matter in modern generators, when produced, is present only for a brief period, is unevenly mixed with the hydrogen gas, is present only in small concentrations and is difficult to reliably detect. The relationship between the detected level of particulate matter and the severity of core damage is generally not well understood making on-line damage assessment virtually impossible.

Another prior art technique uses temperature measured throughout the generator to determine core problems. Because generator temperature changes slowly even when the core has melting hot spots, this technique will not allow rapid problem identification.

Massive core failure is very expensive to repair because the core must be rewound and as a result early detection of failure is necessary.

BRIEF DESCRIPTION OF THE DRAWINGS

FIG. 3B is a spectrum graph of imaginary shaft voltage detected between two ends of the rotor 10;

FIG. 3C is a time domain graph of the differential voltage on shaft 10; and

SUMMARY OF THE INVENTION

Figure 1:
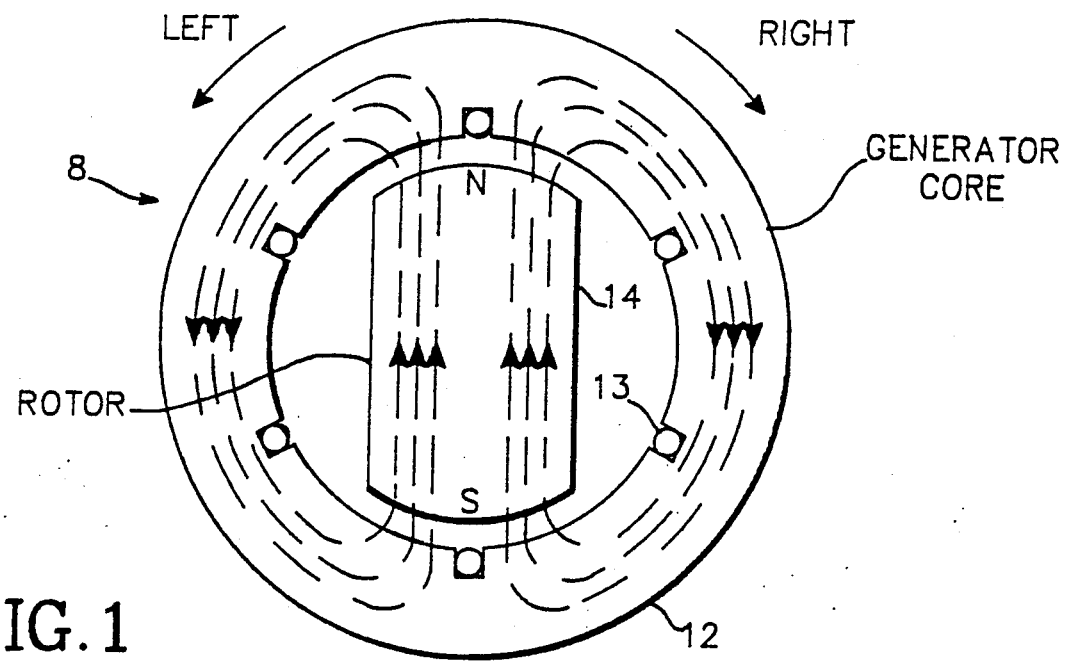
FIG. 1 depicts the elements of a generator 8.

An object of the present invention is to reliability detect the development of insulation failure before serious damage occurs to a generator core.

Another object of the present invention is to provide a core monitor that does not depend on detecting insulation particulate material produced during overheating of the core.

An additional object of the present invention is to provide a simple core monitor.

A further object of the present invention is to provide the ability to assess core damage due to core breakdown while the generator is on-line and while the damage is occurring.

It is still another object of the present invention to allow the prediction of the rate of damage and possible catastrophic failure while a core hot spot is developing.

The present invention accomplishes the above objects by providing a monitor that detects core hot spots where the insulation is breaking down by monitoring rotor shaft voltage. The difference between the shaft voltage on each end of the rotor produces a voltage spectrum that changes as the core develops hot spots. By comparing spectrum samples over time, the development of hot spots can be detected. Shaft brushes are used to obtain the voltage (relative to the adjacent frame) at both ends of the shaft and a differential amplifier produces the difference between the voltages. The differential shaft voltage is converted into a voltage frequency spectrum by a digital-to-analog converter and a Fourier Transform routine executed by a computer. The computer monitors the two components of the spectrum over time for changes and produces an alarm when the changes exceed a threshold or thresholds. The differential voltage signal may also be used to provide alarms when different portions of the time base differential voltage signal within each rotation of the rotor exceed a threshold.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

There are four sources of shaft potential in large turbogenerators: (1) electrostatic charge transferred within the turbine; (2) capacitively coupled voltage between exciter components and the shaft; (3) homopolar voltage due to the integrated normal component of the magnetic field along the shaft; and (4) the dissymmetry voltage associated with small dissymmetries or irregularities in the generator core 12. The first two shaft voltage sources can be represented by high impedance voltage sources in series with the shaft. The very low electrical impedance of the shaft results in these two voltages being reduced to zero along the entire length of the shaft by an effective shaft grounding system. Even if not reduced to zero, they are eliminated by the differential voltage measurement of the present invention. The third and fourth sources of shaft voltage are low impedance sources that cannot be reduced to zero along the entire length of the shaft but only at a single brush or copper braid shaft grounding site. The homopolar voltage is reduced to very low values along the shaft by demagnetization of the rotor 14 before it is placed in the turbine-generator.

The fourth shaft voltage source, the dissymmetry voltage, is generated along the generator shaft and frame by magnetic asymmetry in the generator core 12. The rotating magnetic field leaves the rotor 14 from a north pole, crosses an air gap to the core 12, splits into two flux paths (right and left as seen from an end-view), as illustrated in FIG. 1. The two flux paths travel circumferentially 180° around the core 12, in opposite directions, to rejoin, cross the air gap and enter the south pole of the rotor 14. Two counter circulating magnetic circuit loops are formed which rotate with the rotor 14. The two opposing semicircular magnetic fields within the generator core 12 symmetrically surround the shaft of the rotor 14 (not shown in FIG. 1). If the generator core 12 were magnetically perfectly uniform, that is, if the core 12 contained no defects or irregularities, the two magnetic fields would be equal in magnitude and opposite in direction as they rotate with the shaft. No net magnetic flux would exist around a closed circular path within the generator core 12 and surrounding the shaft of the rotor 10. The inverse of the right hand rule would further imply that no corresponding voltage would be induced along the rotor shaft.

In actual practice, due to the design of the insulated ferromagnetic materials, and due to manufacturing variations within allowable tolerances, the magnetic reluctance of the two magnetic paths through the generator core 12 are different and vary with respect to the rotating shaft and with respect to time. Magnetic flux from the rotor 14 will not divide equally within the generator core 12. A net non-zero flux exists around the closed circular path within the generator core 12 and surrounding the shaft. The inverse of the right hand rule requires that a current and a resulting voltage be induced along the shaft. This differential shaft voltage is an AC signal and, because it is being generated by the non-zero rotating flux, it contains the fundamental and harmonics of the generator running speed. A complex Fourier Transform of this time domain signal represents a fingerprint of the generator core 12 that characterizes the small physical and magnetic variations within the generator core 12.

When the electrical (induced currents due to shorted laminations), physical, or magnetic nature of the generator core 12 changes, due to a physical failure of the core 12, large changes in the shaft dissymmetry voltage fingerprint (complex Fourier Transform of the differential shaft voltage) will be observed. Small (early) failures will produce signals that are two or three times the signal level due to generator core manufacturing tolerances and these voltage changes can be detected. Shaft signals due to the other sources of shaft voltage are cancelled in the differential measurement of the present invention or only add to the noise in the Fourier Transform since they are not synchronous with shaft rotation. Homopolar signals are DC voltage signals and, as a result, only affect the DC component of the voltage spectrum. The direct correlation between core failure and shaft dissymmetry voltage, complete core coverage, and measurement sensitivity of the present invention, means that the present invention will provide a powerful tool for on-line monitoring of the generator core 12 far beyond that possible with the prior art gas core monitor or the core distributed temperature monitoring technique.

Figure 2:
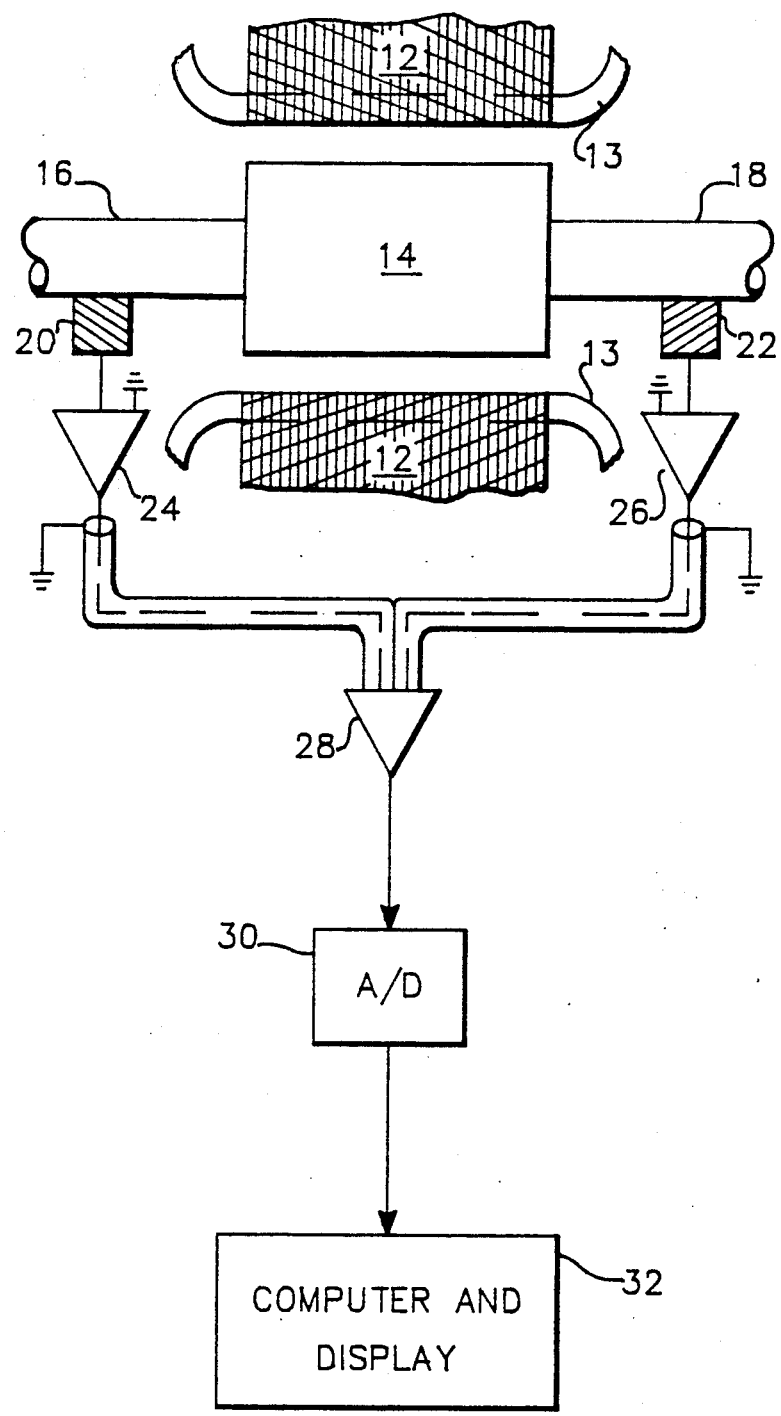
FIG. 2 is a block diagram of the components of the present invention.

The present invention, as illustrated in FIG. 2, provides on-line and continuous detection of generator core 12 failure by measuring the difference in rotor shaft voltages across the ends 16 and 18 of the rotor shaft using standard spring biased shaft brushes 20 and 22. Doubly shielded, high impedance, differential isolation amplifiers 24 and 26, such as an AD293 available from Analog Devices are connected to the brushes 20 and 22 and are grounded at the machine frame. The ground connection should be near the brush-shaft contact point to minimize loop flux pickup. A third differential amplifier 28 of the same type as amplifiers 24 and 26 is used to produce the shaft differential voltage. The output of the amplifier 28 is applied to an analog-to-digital converter 30 such as an AD7574 available from Analog Devices which allows a computer 32 to perform a Fourier Transform of the differential voltage. An IBM AT microcomputer is a suitable computer 32. Fourier Transform algorithms that will run on a personal computer are available to those of ordinary skill in the art. If a Motorola 6800 based microcomputer is used, a suitable FFT routine is disclosed by Lord, "Fast Fourier For the 6800", Byte, February 1979, pages 108-119. Shaft dissymmetry voltage signals are identified by their harmonic relationship to the generator running speed in a continuous Fourier Transform of the time domain shaft dissymmetry voltage signal.

Figure 3A:
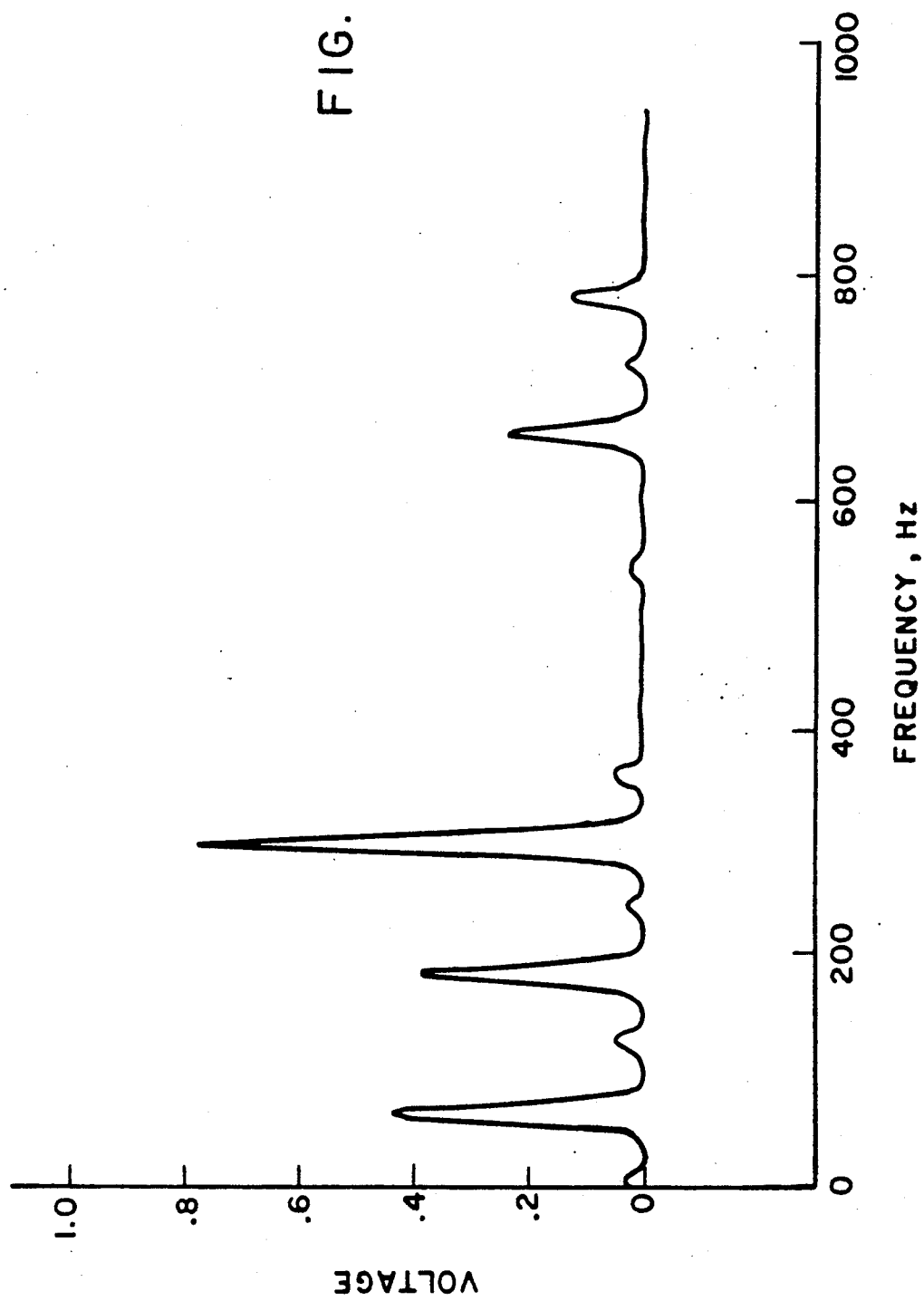
FIG. 3A is a spectrum graph of real shaft voltage detected between two ends of a rotor 10.

The Fourier Transform represents a fingerprint of the core and reflects the degree and nature of dissymmetry within the generator core 12. Small peaks in the spectrum are associated with the core 12 structure and asymmetries are associated with variations in manufacture. Example of spectrums of the real and imaginary components of the shaft voltage signal are shown in FIGS. 3A and 3B. Core 12 changes brought about by malfunctions can be identified by corresponding growth in one or both generator harmonic components of these spectra. The present invention continuously compares the amplitudes and/or relative amplitudes of various frequency components in one or both of the spectra, as well as new components, to detect, qualify and quantify generator core failures from their onset. The growth or development of a malfunction may also be determined by instrumented or manual analysis of spectrum changes. Malfunction detection can also be accomplished in the time domain by dividing the differential voltage signal for each rotation of the shaft into sections, as illustrated in FIG. 3C, and detecting changes in these sections of the time domain signature over time in the same manner as changes in the spectra.

For example, in an automatic analysis system when the generator is first brought on-line, the core 12 spectrum fingerprint is produced or the time domain rotation fingerprint is produced. This initial fingerprint is surrounded by high trigger thresholds of, for example, ten percent. For a fingerprint as shown FIG. 3A at the highest real frequency spectrum peak which occurs at approximately 0.78 volts, one of the thresholds would be 0.858 volts. If the sampled spectrum at this point crosses the threshold, the computer 32 produces an alarm to alert a plant operator. The plant operator could immediately begin taking the generator off-line, if the change in the spectrum is large, or begin a monitoring process to watch the changes. The monitoring process could store the spectrum changes over time and provide a graph that shows the rate of change. From the rate of change the growth of the malfunction can be determined and decisions concerning whether to take the generator off-line can be made. In this same way, thresholds can be established for the entire spectrum and changes in any part of the spectrum would alert an operator. In this same manner, the imaginary spectra of FIG. 3B or the time domain signal of FIG. 3C can be used to detect changes.

Since core hot spots can develop rather rapidly, an analysis cycle of a few seconds is preferred to ensure rapid detection. Because the signal spectrum has a bandwidth from 0 Hz to approximately 1000 Hz, an A/D converter 30 which is capable of sampling at least 2000 times per second is necessary. The A/D converter previously mentioned is more than adequate for this sample rate. A sample period of 0.0005 seconds is sufficient to accurately produce a generator fingerprint.

Figure 4:
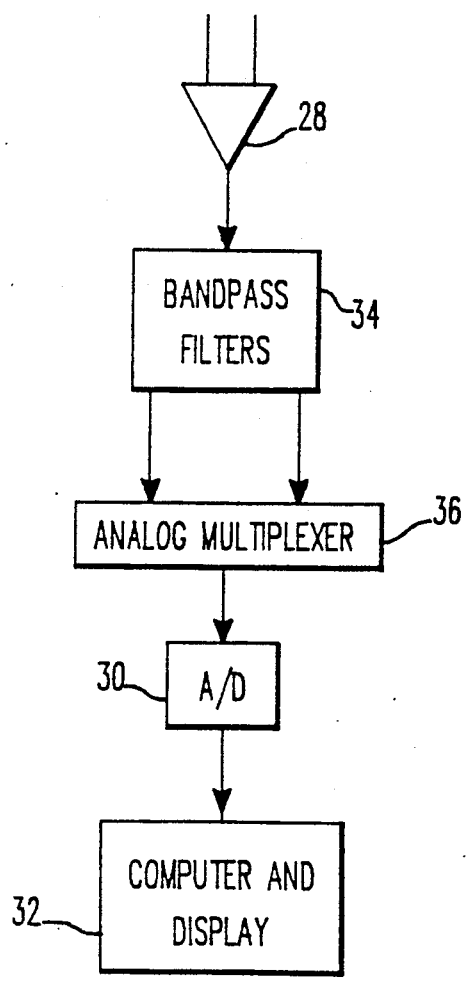
FIG. 4 illustrates an alternate embodiment of a portion of the present

Another embodiment of the present invention which is less expensive and less able to detect very small changes but capable of monitoring rapid changes in the core 12 is illustrated in FIG. 4. The differential signal produced by amplifier 28 is applied to a group of bandpass filters 34 which isolate selected peaks within the fingerprint. Suitable audio frequency bandpass filters can be obtained from EXAR Corporation. The outputs of the filters 34 are multiplexed to the A/D converter 30 by an analog multiplexer 36 such as and AD7501 from Analog Devices. The computer 32 then need only monitor changes in a limited number of points. The relatively time consuming Fourier Transform algorithm is not needed and the outputs of the converter 30 need only be compared to the thresholds. If a particular core 12 can be characterized by changes in only a very limited number of frequency components, the computer 32 can be eliminated and an analog threshold devices substituted.

Not only does the present invention allow changes in the core 12 to be detected rapidly and accurately but also allows the damage to the core 12 to be assessed while the generator 8 is still on-line and allows prediction of future damage if the generator remains on-line. For example, by understanding the correlation between changes in the malfunction and the progression of damage, specific developing malfunction modes can be recognized and their consequences anticipated if no corrective action is taken. When the output of the present invention is correlated with other core 12 monitoring techniques significant improvement in core 12 damage control can be achieved. It is also possible to monitor the state of the rotor 14 and rotor windings as well as stator windings using this technique. The present invention can also be applied to large motors.

Core monitoring, according to the present invention, is less complicated, less expensive, and non-intrusive since it employs the existing shaft to monitor the generator core. In addition, a generator hydrogen pressure seal and hydrogen gas sampling device are not required.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordinglY all suitable modifications and equivalents may be resorted to, falling within the scope of the invention.

What we claim is:

1. A generator core monitor for a generator having a frame and a rotor shaft which has first and second rotor shaft ends, comprising:
    sensing means for sensing a voltage between ends of the rotor shaft, including:
        a first shaft brush contacting the first rotor shaft end;
        a second shaft brush contacting the second rotor shaft end; and
        differential measurement means for determining a difference in first and second differential voltages produced between the corresponding first and second shaft brushes and ground, comprising:
            first differential means for determining the first differential voltage between a first brush voltage and ground;
            second differential means for determining the second differential voltage between a second brush voltage and ground; and
            third differential means for determining the difference in said first and second differential voltages; and
    analysis means for detecting changes in the difference.

2. A monitor as recited in claim 1, wherein said first differential means comprises a first isolation amplifier connected to said first brush and ground, said second differential means comprises a second isolation amplifier connected to said second brush and ground, and said third differential means comprises a differential amplifier connected to said first and second isolation amplifiers and said analysis means.

3. A monitor as recited in claim 1, wherein said analysis means comprises:
    an analog-to-digital converter connected to said sensing means; and
    computation means, connected to said analog-to-digital converter, for converting the difference into a voltage spectrum, detecting changes in the voltage spectrum over time and producing an alarm when the changes exceed a threshold.

4. A monitor as recited in claim 1, wherein said analysis means comprises:
    a bandpass filter connected to said sensing means;
    an analog-to-digital converter connected to said bandpass filter and producing an output; and
    computation means, connected to said analog-to-digital converter, for monitoring changes in the output of said analog-to-digital converter and producing an alarm when the changes exceed a threshold.

5. A monitor as recited in claim 1, wherein said analysis means comprises:
    an analog-to-digital converter connected to said sensing means; and
    computation means, connected to said analog-to-digital converter, for detecting changes in a time domain signature of the difference over time.

6. A generator core monitor for a generator with a rotor shaft and a frame, comprising:
    first and second shaft brushes contacting first and second ends of the rotor shaft;
    a first differential amplifier connected to said first brush and ground;

a second differential amplifier connected to said second brush and ground;

a third differential amplifier connected to said first and second differential amplifiers;

an analog-to-digital converter connected to said third differential amplifier; and a computer connected to said analog-to-digital converter, producing first and second current voltage signals of a corresponding voltage difference between voltages produced between said first and second shaft brushes and ground, producing a first difference signal between the first and second current voltage signals, computing a difference value between the first difference signal and a previous first difference signal and producing an alarm when a threshold is exceeded by the difference value.

7. A monitor as recited in claim 6, wherein the the first difference signal is computed into a time domain signal.

8. A monitor as recited in claim 6, wherein the the first difference signal.

* * * * *